United States Patent [19]

Nickel et al.

[11] Patent Number: 5,893,948

[45] Date of Patent: Apr. 13, 1999

[54] METHOD FOR FORMING SINGLE SILICON CRYSTALS USING NUCLEATION SITES

[75] Inventors: Norbert H. Nickel, Mountain View; Gregory B. Anderson, Woodside; Steven E. Ready, Santa Cruz; James B. Boyce, Los Altos; Ping Mei, Palo Alto, all of Calif.

[73] Assignee: Xerox Corporation, Stamford, Conn.

[21] Appl. No.: 08/630,955

[22] Filed: Apr. 5, 1996

[51] Int. Cl.$^6$ .................................................. C30B 13/06
[52] U.S. Cl. .............................. 117/43; 117/45; 117/902; 117/933
[58] Field of Search ................................ 117/43, 45, 902, 117/933

[56] References Cited

U.S. PATENT DOCUMENTS

| | | |
|---|---|---|
| 4,330,363 | 5/1982 | Biegesen et al. |
| 4,333,792 | 6/1982 | Smith ............................... 428/446 |
| 4,371,421 | 2/1983 | Fan et al. ............................ 117/933 |
| 4,388,145 | 6/1983 | Hawkins et al. |
| 4,497,683 | 2/1985 | Celler et al. ........................ 117/993 |
| 4,536,251 | 8/1985 | Chiang et al. |
| 4,670,086 | 6/1987 | Leamy ................................ 117/933 |
| 4,693,759 | 9/1987 | Noguchi et al. ...................... 437/24 |
| 4,861,418 | 8/1989 | Nishimura et al. ................. 117/933 |
| 4,906,594 | 3/1990 | Yoneda et al. ..................... 437/228 |
| 4,915,772 | 4/1990 | Fehlner et al. ...................... 117/43 |
| 5,037,774 | 8/1991 | Yamawaki et al. ................. 437/84 |
| 5,061,655 | 10/1991 | Ipposhi ............................. 117/45 |
| 5,322,589 | 6/1994 | Matsuoka et al. ................. 117/933 |

FOREIGN PATENT DOCUMENTS

| | | | |
|---|---|---|---|
| 59-128292 | 7/1984 | Japan ............................ 117/933 |
| 63-79953 | 4/1988 | Japan ............................ 117/933 |
| 02-9089 | 1/1993 | Japan ............................ 117/95 |

OTHER PUBLICATIONS

James S. Im and H.J. Kim, "On the super lateral growth phenomenon observed in excimer laser–induced crystallization and thin Si films", Appl. Phys. Lett. 64(17), 25 Apr. 1994, pp. 2303–2305.

Hiroyuki Kuriyama et al., "Comprehensive Study of Lateral Grain Growth in Poly–Si Films by Excimer Laser Annealing and Its Application to Thin Film Transistors", JPN. J. Appl. Phys., vol. 33 (1994), pp. 5657–5662, Part 1, No. 10, Oct. 1994.

R.I. Johnson et al., "Critical Lasere Fluence Observed in (111) Texture, Grain Size and Mobility of Laser Crystalized AmorphousSilicon", Mat. Res. Soc. Symp. Proc., vol. 297, 1993, pp. 533–538.

Kumomi, Hideya and Takao Yonehara, "Manipulation of Nucleation Sites in Solid–State Crystallization of Amorphous Si Films", MRS Proceedings 202, pp. 645–650 (1991).

Stutzmann, M., C.E. Nebel, P.V. Santos and M. Henitze, "Laterally Strctured Si Thin Films for Solar Cell Applications", 7th Sunshine Workshop, Tokyo, Japan, pp. 35–42 (1993).

Primary Examiner—Robert Kunemund
Attorney, Agent, or Firm—Oliff & Berridge, PLC

[57] ABSTRACT

The invention provides a method for forming a plurality of single silicon crystals over a substrate. The method forms a plurality of nucleation sites over the substrate. An amorphous silicon layer is formed over the substrate covering the plurality of silicon nucleation sites. The amorphous silicon layer is melted by using a laser beam and then crystallized to form the plurality of single silicon crystals. Each of the plurality of single silicon crystals correspond to one of the plurality of nucleation sites.

20 Claims, 7 Drawing Sheets

METHOD FOR FORMING SINGLE SILICON CRYSTALS USING NUCLEATION SITES

BACKGROUND OF THE INVENTION

1. Field of the Invention

This invention relates to a method for forming single silicon crystals by laser crystallization.

2. Description of Related Art

As the demand for higher performance two-dimensional arrays used in devices such as displays and scanners increases, the requirements for higher performance thin film transistors (TFTs) to integrate high speed electronic circuits with the two-dimensional arrays also increase. However, because conventional TFTs are manufactured using polycrystalline silicon thin films having small grain sizes, the performance of conventional TFTs is limited by undesirable low field-effect mobilities inherent in these polycrystalline silicon thin films.

Field-effect mobilities are reduced by grain boundaries. Thus, if the polycrystalline silicon film contains large grain sizes, then the number of grain boundaries per unit area would be reduced and the field-effect mobility would be improved. Accordingly, many efforts have been advanced to increase field-effect mobilities by producing polycrystalline silicon thin films having large crystal grain sizes so that greater performance polycrystalline silicon TFTs may be obtained.

Prior efforts to increase polycrystalline silicon grain sizes have relied on solid phase crystallization in which an entire assembly (i.e., the substrate and deposited films) is heated at high temperatures for many hours to encourage large crystal growth. However, solid phase crystallization has several drawbacks: 1) throughput is low because a large amount of time is required to form large crystal grains; and 2) glass substrates are subjected to high temperatures causing many adverse effects such as warping and bending of the glass substrates.

Besides having small grain sizes, the polycrystalline silicon films formed by prior processes also have a problem of varying grain densities. Since polycrystalline silicon grains are formed randomly, there is no control of the number of grains formed or the distribution of grain sizes. In fact, many polycrystalline silicon films have greatly varying grain sizes. The performance of TFTs formed in these polycrystalline silicon films strongly depends on the locations of the devices since grain size and density vary greatly over the substrate area. Thus, dependable electronic circuitry cannot be realized even though the average polycrystalline silicon grain size is increased.

SUMMARY OF THE INVENTION

The invention provides a method for forming a plurality of single silicon crystals over a substrate. The method includes forming a plurality of silicon nucleation sites over the substrate. A first amorphous silicon layer is formed over the substrate covering the plurality of silicon nucleation sites. The first amorphous silicon layer is melted using a first laser beam and then crystallized to form the plurality of single silicon crystals. Each of the plurality of single silicon crystals is formed from one of the plurality of silicon nucleation sites.

The plurality of nucleation sites are either a plurality of nucleation seeds or a plurality of exposed portions of a nucleation layer. The plurality of nucleation seeds are formed in a second amorphous silicon layer deposited over the substrate. The second amorphous silicon layer is melted using a second laser beam and the molten silicon is crystallized into a polycrystalline silicon layer. The polycrystalline silicon layer is patterned and etched into a plurality of seed columns forming the plurality of nucleation sites.

The invention also provides another method for forming the plurality of nucleation seeds. A plurality of interfering laser beam arrays illuminate the second amorphous silicon layer formed over the substrate. Portions of the second amorphous silicon layer where one beam of each of the plurality of laser beam arrays illuminate are melted and crystallized to form a plurality of nucleation seeds in the second amorphous layer.

The invention also provides a method for forming nucleation sites by using a nucleation layer. The nucleation layer is formed over the substrate and then an insulative layer is formed over the nucleation layer. The insulative layer is patterned and etched to expose the nucleation layer forming the plurality of nucleation sites.

BRIEF DESCRIPTION OF THE DRAWINGS

The invention is described in detail with reference to the following drawings, wherein like numerals represent like elements.

DETAILED DESCRIPTION OF PREFERRED EMBODIMENTS

Figure 1A:
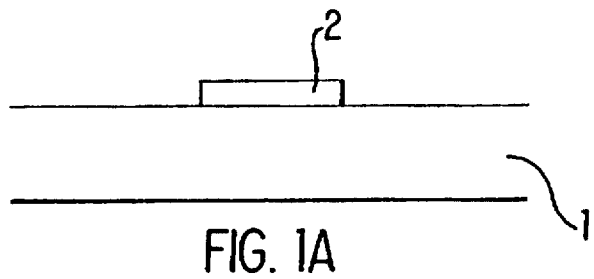
FIG. 1 shows a process for growing large polycrystalline silicon grains along a perimeter of a polycrystalline silicon island.
Figure 1B:
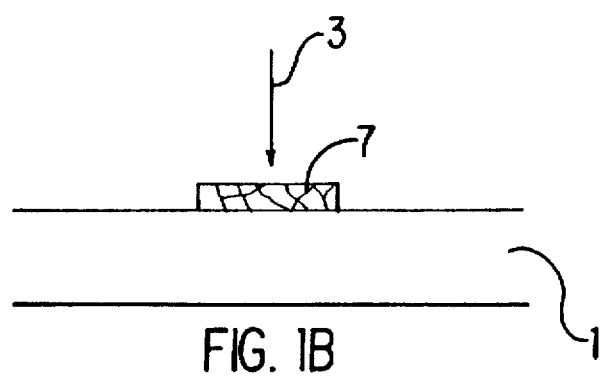
Figure 1C:
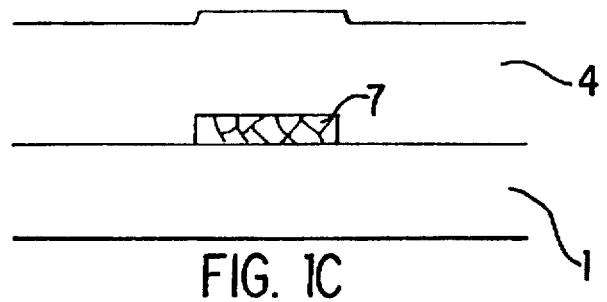
Figure 1D:
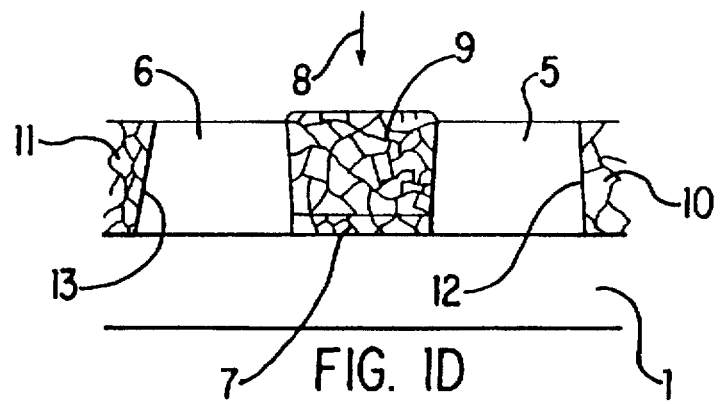

FIG. 1A–1D shows an experimental process that forms a polycrystalline silicon film having large grains. First, a polycrystalline silicon island is formed by conventional methods. As shown, in FIG. 1A, an amorphous silicon island 2 is formed over a substrate 1. The amorphous silicon island 2 is melted using a laser beam 3. When the silicon cools and crystallizes, a polycrystalline silicon island 7 is formed, as shown in FIG. 1B. A layer of amorphous silicon 4 is then formed by conventional methods over the substrate 1 and the polycrystalline silicon island 7, as shown in FIG. 1C. The amorphous silicon layer 4 is then melted and crystallized using laser beam 8, as shown in FIG. 1D. When the silicon material from the amorphous silicon layer 4 cools and crystallizes, large silicon grains 5 and 6 form along a perimeter of the polycrystalline silicon island 7.

An explanation for the growth of large silicon grains 5 and 6 is as follows: Grains along the perimeter of the polycrystalline silicon island 7 serve as nucleation seeds. When the silicon of the amorphous silicon layer 4 is melted and then cooled, the silicon begins to crystallize from each nucleation seed. As crystals grow from adjacent nucleation seeds in a direction radially away from the polycrystalline silicon island 7, more silicon is available to be crystallized because of the expanding circumference. Thus crystals from adjacent nucleation seeds have more silicon to crystallize before the crystal boundaries of the adjacent crystals interfere with each other.

This is not the case for crystals 9 that grow directly above the polycrystalline silicon island 7. Thus, the crystals 9 directly above the polycrystalline silicon island 7 remain small. Small crystals 10 and 11 are also formed against the crystal boundaries 12 and 13 of the large silicon grains 5 and 6, respectively. The small crystals 10 and 11 are formed spontaneously in the molten silicon. Because a large number of crystals form, the crystal boundaries interfere with each other and prevent the crystals from becoming large.

Figure 2:
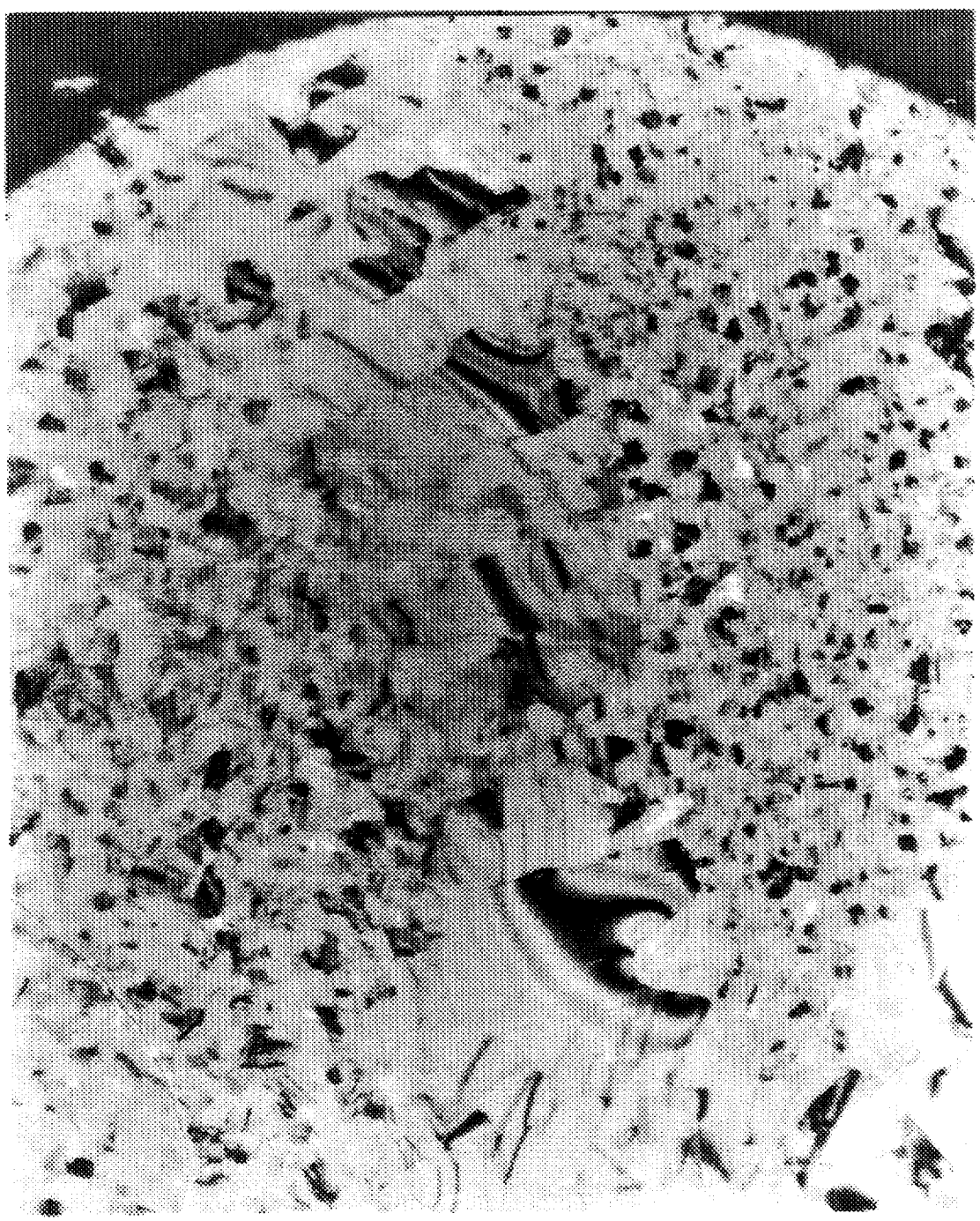
FIG. 2 is a planar view of a transmission-electron microscopy (TEM) micrograph of large polycrystalline silicon grains along the perimeter of a polycrystalline silicon island.

FIG. 2 shows a transmission-electron microscopy (TEM) micrograph of a polycrystalline silicon film formed using the process described above. The lower left corner in FIG. 2 is a portion of a polycrystalline silicon island corresponding to the polycrystalline silicon island 7 above. Large polycrystalline silicon grains corresponding to the large silicon grains 5 and 6 are formed along the perimeter of the polycrystalline silicon island. In FIG. 2, the large polycrystalline silicon grains proceed from the bottom right of the figure through the center and then to the upper left of the figure. Small grains corresponding to the small crystals 10 and 11 form along the outside perimeter of the large grains. These small grains are in right side of FIG. 2 following the perimeter of the large polycrystalline silicon grains. This TEM micrograph confirms that large crystal grains grow along the perimeter of a polycrystalline silicon island using the process discussed above.

Figure 3A:
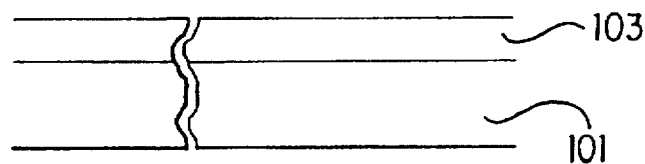
FIG. 3A–3E is a method for forming polycrystalline silicon films with large grain sizes by first forming nucleation seeds.
Figure 3B:
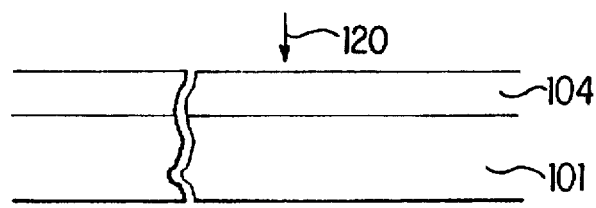

In FIGS. 3A–3E, a preferred embodiment of the invention forms single silicon crystals by taking advantage of the polycrystalline silicon crystal growth behavior explained above. In FIG. 3A, an amorphous silicon layer 103 is formed over a substrate 101 by conventional methods such as low pressure chemical vapor deposition (LPCVD), plasma enhanced chemical vapor deposition (PECVD), sputtering, laser deposition, or hot wire deposition and related techniques. Unhydrogenated or hydrogenated amorphous silicon, a-Si:H, may be used to form the amorphous silicon layer 103. As shown in FIG. 3B, the amorphous silicon layer 103 is melted and crystallized using a laser beam 120 to form a polycrystalline silicon layer 104. The polycrystalline silicon layer 104 is patterned and etched to form nucleation seeds 105, 107 and 109.

The amorphous silicon layer 103 is about 100–200 Å thick so that large polycrystalline silicon grains can be formed. If the amorphous silicon layer 103 is too thick, the laser beam 120 may not be able to melt through the amorphous silicon layer 103 resulting in smaller polycrystalline silicon grains. It is also more difficult to form large polycrystalline silicon grains when the amorphous silicon film 103 is too thick.

However, if the amorphous silicon layer 103 is too thin, not enough silicon is present to generate large polycrystalline silicon grains. In addition, the laser beam 120 often causes ablation of a thin amorphous silicon film 103 because it is difficult to adjust the laser fluence to melt only the thin amorphous silicon film 103, resulting in undesirable delamination of the polycrystalline silicon layer 104 from the substrate 101. Thus, the thickness of the amorphous silicon layer 103 and the laser fluence of laser beam 120 should be matched to obtain good results.

For a preferred embodiment, an excimer laser beam having a laser fluence of about 180–220 mJ/cm$^2$ may be used as the laser beam 120. Large polycrystalline silicon grains are formed using this laser fluence range and at the same time ablation of the polycrystalline silicon layer 104 from the substrate 101 is avoided.

An excimer laser provides for a large area single pulse laser beam so that the amorphous silicon layer 103 is crystallized by a single laser pulse. However, if the surface area of the amorphous silicon layer 103 is larger than the cross-section of the excimer laser beam, the amorphous silicon layer 103 may be crystallized by repeated exposure to the excimer laser beam.

Because an excimer laser has a large beam cross-section, the process of crystallizing the amorphous silicon layer 103 proceeds much faster than crystallizing the amorphous silicon layer 103 using a CW laser, for example. The CW laser has a much smaller beam cross-section. In order to melt and crystallize the amorphous silicon layer 103, the CW laser beam must serially scan the amorphous silicon layer 103 using the small cross-section beam. The serial scan process is very time consuming.

Figure 3C:
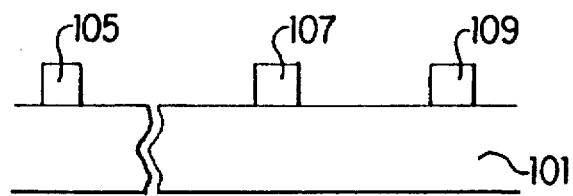

After the amorphous silicon layer 103 is crystallized into a polycrystalline silicon layer 104 by exposure to the laser beam 120, the polycrystalline silicon layer 104 is patterned and etched to form seed columns such as 105, 107 and 109, as shown in FIG. 3C. The seed columns 105, 107 and 109 preferably have an average cross-sectional width of less than 1000 Å. Using available technology, an average cross-sectional width of about 800–1000 Å are achievable. Smaller seed column cross-sectional widths are preferable.

The seed columns 105, 107 and 109 are located at positions on the surface of the substrate 101 where thin film transistors (TFTs) are desired for manufacturing an electronic device. Each of the seed columns 105, 107 and 109 preferably contains a single grain of the polycrystalline silicon layer 104.

Figure 3D:
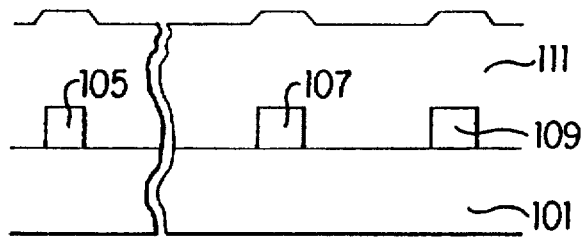

After the seed columns 105, 107 and 109 are formed, an amorphous silicon layer ill is formed over the substrate 101 and over the seed columns 105, 107 and 109 using conventional methods, as shown in FIG. 3D. The amorphous silicon layer 111 may be about 800–1000 Å thick and may be formed using unhydrogenated or hydrogenated amorphous silicon, a-Si:H.

Figure 3E:
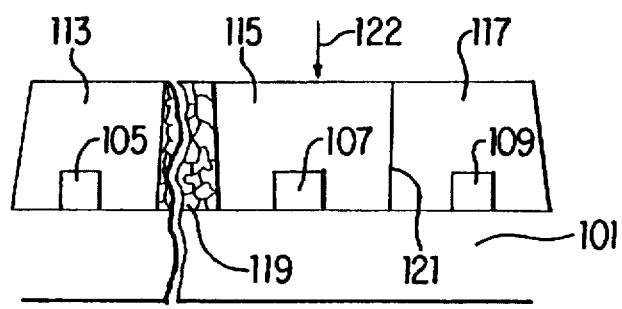

As shown in FIG. 3E, the amorphous silicon layer 111 is crystallized using an excimer laser beam 122. Single silicon crystals 113, 115 and 117 are formed corresponding to the seed columns 105, 107 and 109, respectively. Because each seed column 105, 107 and 109 contains only one silicon crystal, only a single silicon crystal is formed from each seed column 105, 107 and 109. Since one single silicon crystal is formed at the location of each seed column 105, 107 and 109, the seed columns 105, 107 and 109 are called nucleation sites.

The fluence of the laser beam 122 ranges between about 280–440 mJ/cm$^2$. The laser fluence and the thickness of the amorphous silicon layer 111 are adjusted for growth of large polycrystalline silicon grains as explained above.

Because a single silicon crystal has a slightly higher melting point than amorphous silicon, the seed columns 105, 107 and 109 do not melt when the laser beam 122 is adjusted to melt only the amorphous silicon layer 111. However, if the laser fluence is slightly greater than required to melt the amorphous silicon layer 111, only the top most portions of the seed columns 105, 107 and 109 will melt, leaving the remaining unmelted portions of the seed columns 105, 107 and 109 to serve as nucleation seeds. If the laser fluence is too high, all of the seed columns 105, 107 and 109 would melt and the process would be inoperative. Thus, the laser fluence must be set so that at least a portion of the seed column is not melted by the laser beam 122. The unmelted portions of the seed columns 105, 107 and 109 provide the nucleation seeds from which single crystals 113, 115 and 117 are formed.

As discussed above, large silicon grains form around the perimeter of the polycrystalline silicon island 7. However, because the seed columns 105, 107 and 109 are each a single silicon crystal, a single crystal of silicon is formed emanating from the seed columns 105, 107 and 109. In FIG. 3E, seed columns 107 and 109 are so close to each other that the single crystals formed by the seed columns 107 and 109 grow until the crystal grain boundaries of the single crystals emanating from seed columns 107 and 109 meet at the crystal grain boundary 121. The crystal columns 105 and 107 are far apart from each other. Thus, small grains 119 form spontaneously separating the crystal grain boundaries of the crystals corresponding to seed columns 105 and 107.

The average cross-sectional width of the single silicon crystals 113, 115 and 117 is greater than about 10 μm which is larger than required for a TFT structure. Because the seed columns 105, 107 and 109 are patterned to be located at the exact locations where TFTs are to be formed, the single silicon crystals 113, 115 and 117 are also positioned at the required TFT locations. Thus, a single silicon crystal is provided for each of the TFTs of the electronic device.

Because the field-effect mobilities of TFTs formed on single silicon crystals are greater than about 1000 cm$^2$/V-s as compared to about 100 cm$^2$/V-s for polycrystalline silicon TFTs, the performance of the TFTs formed in the single silicon crystals is far greater than TFTs formed in conventional polycrystalline silicon thin films. Thus, the above process provides for high performance single crystal TFTs by forming single silicon crystals for each TFT.

Because the seed columns 105, 107 and 109 are formed by patterning and etching the polycrystalline silicon layer 104, there is a possibility that the seed columns 105, 107 and 109 may contain more than one grain of the polycrystalline silicon layer 104. The number of multiple grain seed columns 105, 107 and 109 is reduced by increasing the grain sizes of the polycrystalline silicon layer 104. When each of the seed columns 105, 107 and 109 contain more than one grain, one single crystal will crystallize from each grain. Thus, multiple silicon crystals will result for those seed columns 105, 107 and 109 that contain more than one grain. The TFTs that are formed may be formed in one of the multiple silicon crystals or formed over more than one silicon crystal. Because of the small number of crystal boundaries, the performance of the TFTs formed over multiple large silicon crystals is still greatly improved over TFTs formed in conventional polycrystalline silicon films having much smaller grain sizes.

Figure 4A:
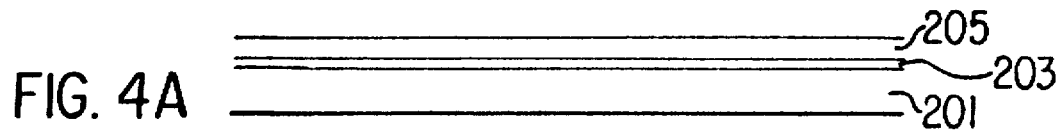
FIG. 4A–4D is a process for forming polycrystalline silicon films with large grain sizes by forming metal nucleation sites.
Figure 4B:
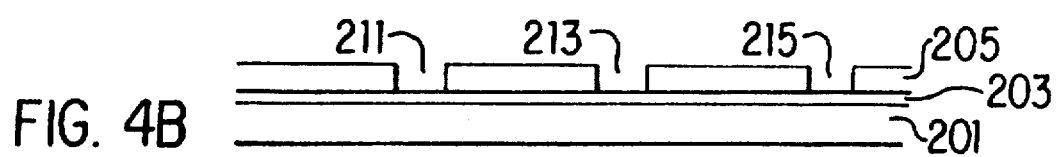
Figure 4C:
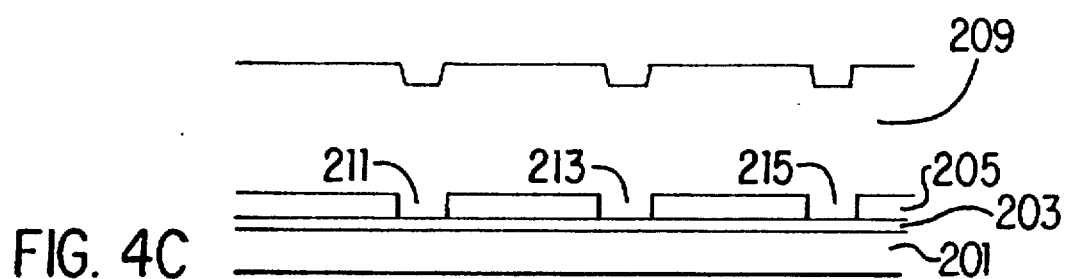

FIG. 4A–4D shows another embodiment of the invention. A metal layer 203 is formed over the surface of a substrate 201. An insulative layer 205 is formed over the metal layer 203. The insulative layer 205 includes materials such as silicon nitride, silicon dioxide or a combination of layers comprising of similar materials. The insulative layer 205 is patterned and etched exposing the metal layer 203 to form nucleation sites 211, 213 and 215, as shown in FIG. 4B.

Then, an amorphous silicon layer 209 is formed by conventional methods over the substrate covering the insulative layer 205 and the nucleation sites 211, 213 and 215.

The thickness of the amorphous silicon layer 209 may be about 800–1000 Å. The thickness of the insulative layer 205 should be adjusted so that the amorphous silicon layer 209 covers the nucleation sites 211, 213 and 215 completely. A preferred thickness of the insulative layer 205 may be about one half (½) the thickness of the amorphous silicon layer 209. Thus, when the amorphous silicon layer 209 is about 800–1000 Å thick, the insulative layer 205 may be about 400–500 Å thick.

The amorphous silicon layer 209 is melted and crystallized by using an excimer laser beam 223 to form single silicon crystals 217, 219 and 221 which correspond to the nucleation sites 211, 213 and 215. The laser beam 223 has a laser fluence of about 280–440 mJ/cm$^2$. The thickness of the amorphous silicon layer 209 and the laser fluence of laser beam 223 are adjusted to maximize the size of single silicon crystals 217, 219 and 221 and to avoid ablation as discussed earlier.

The nucleation sites 211, 213 and 215 form silicon nucleation seeds after the laser beam 223 melts the amorphous silicon layer 209. The portion of the molten silicon contacting the metal layer 203 at the nucleation sites 211, 213 and 215 is cooled by the metal layer 203. The cooled portion of the molten silicon on the surface of the metal layer 203 crystallizes to form nucleation seeds. As other portions of the molten silicon farther away from the metal layer 203 cools, silicon crystals grow starting from the nucleation seeds in the nucleation sites 211, 213 and 215 to form single silicon crystals 217, 219 and 221.

Figure 4D:
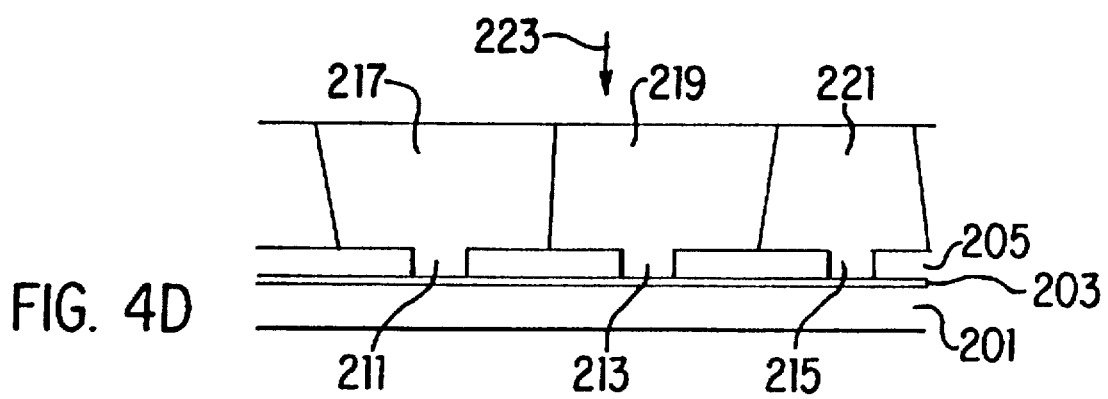

The nucleation sites 211, 213 and 215 may be placed in any desired position on the surface of the insulative layer 205. Thus, while FIG. 4D shows the nucleation sites 211, 213 and 215 adjacent to each other, these sites may be located in any location where TFTs are required. If the nucleation sites are far apart and the single silicon crystal boundaries do not meet, the space between two adjacent single silicon crystal boundaries is filled with small polycrystalline silicon grains similar to the polycrystalline silicon grains 119 shown in FIG. 3E. Subsequent to the formation of the single silicon crystals 217, 219 and 221, TFTs may be fabricated in the single silicon crystal areas forming high performance TFTs.

Figure 5A:
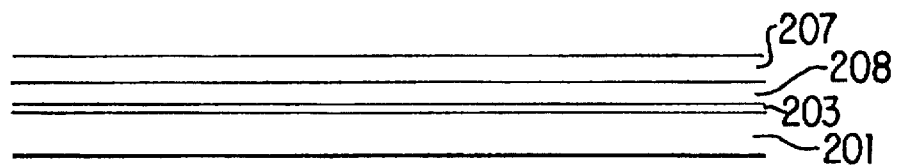
FIG. 5A–5D is a method for forming polycrystalline silicon films with large grain sizes by forming silicon nitride nucleation sites.
Figure 5B:
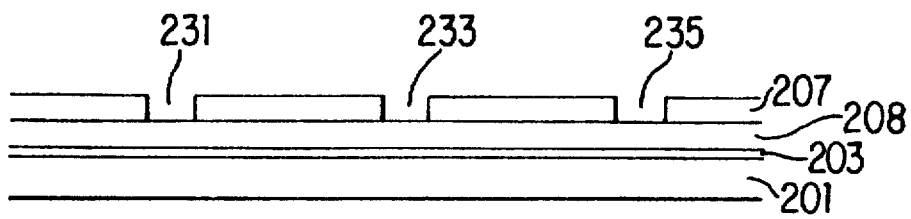
Figure 5C:
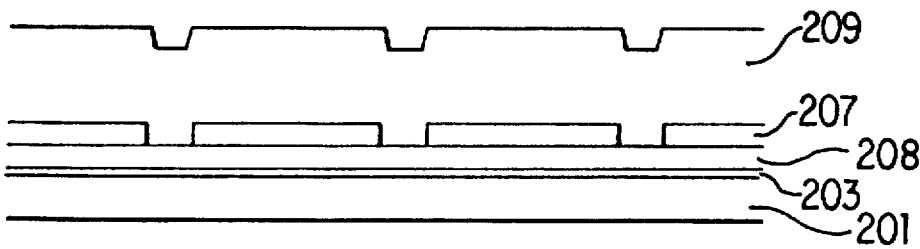
Figure 5D:
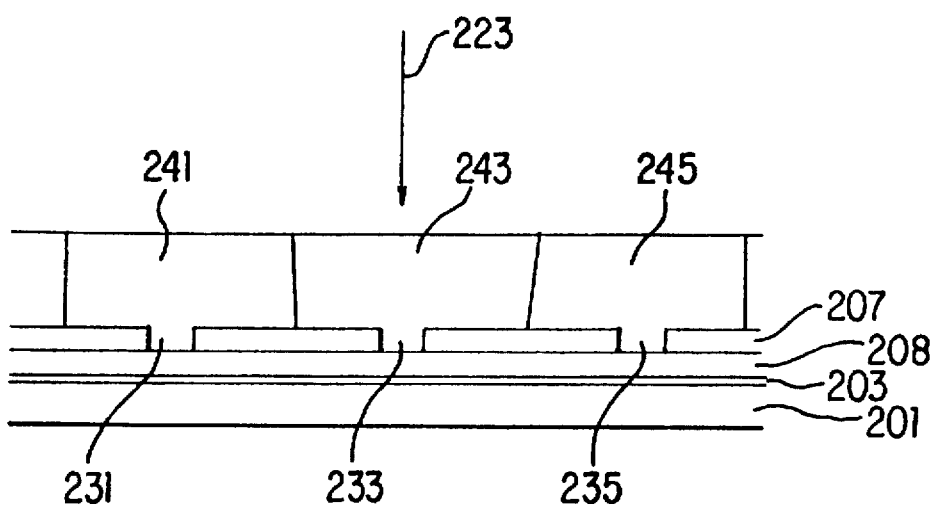

Another embodiment of the invention is shown in FIG. 5A–5D. This embodiment is similar to the embodiment shown in FIG. 4A–4D except a second insulative layer 207 is formed over a first insulative layer 208. The first insulative layer 208 is a layer that promotes nucleation of silicon such as a silicon nitride layer. The metal layer 203 is unnecessary for this embodiment. The second insulative layer 207 is patterned and etched to form nucleation sites 231, 233 and 235, as shown in FIG. 5B. The amorphous silicon layer 209 is formed over the surface of the second insulative layer 207 and covers the nucleation sites 231, 233 and 235, as shown in FIG. 5C.

The amorphous silicon layer 209 may be about 800–1000 Å thick and is melted by the excimer laser beam 223. The molten silicon within the nucleation sites 231, 233 and 235 form single silicon crystal nucleation seeds because the nucleation sites 231, 233 and 235 cool portions of the molten silicon in the nucleation sites 231, 233 and 235. The thermal gradient in the nucleation sites 231, 233 and 235 is greater than the thermal gradient above the surface of the insulative layer 207. Thus, the molten silicon in the nucleation sites 231, 233 and 235 cools at a faster rate. As other portions of the molten silicon cools, single silicon crystals 241, 243 and 245 are formed from the single crystal nucleation seeds corresponding to the nucleation sites 231, 233 and 235.

Figure 6A:
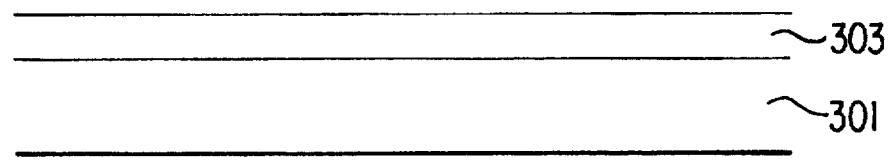
FIG. 6A–6D is a method for forming polycrystalline silicon films with large grain sizes by using interference of laser beam arrays to form nucleation seeds.
Figure 6B:
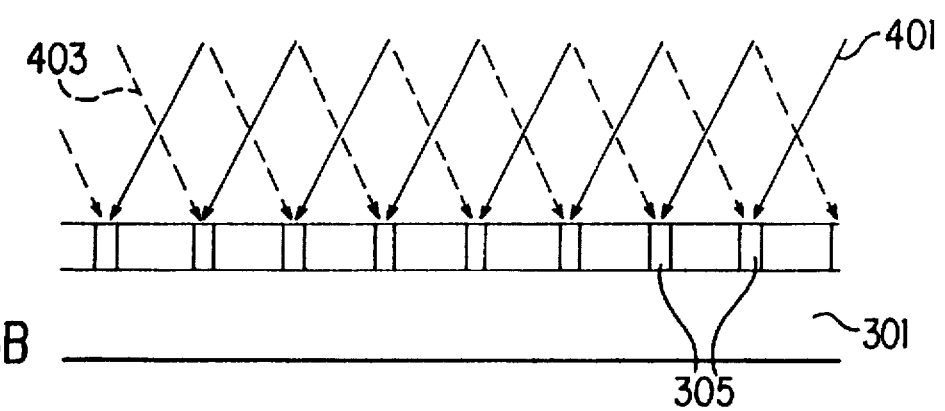

FIGS. 6A–6D show another embodiment of the invention that is similar to the embodiments shown in FIG. 3A–3E. In FIG. 6A, an amorphous silicon layer 303 is formed by conventional methods over the substrate 301. The amorphous silicon layer 303 may be formed using unhydrogenated or hydrogenated amorphous silicon a-Si:H having a thickness of about 100–200 Å.

Figure 7:
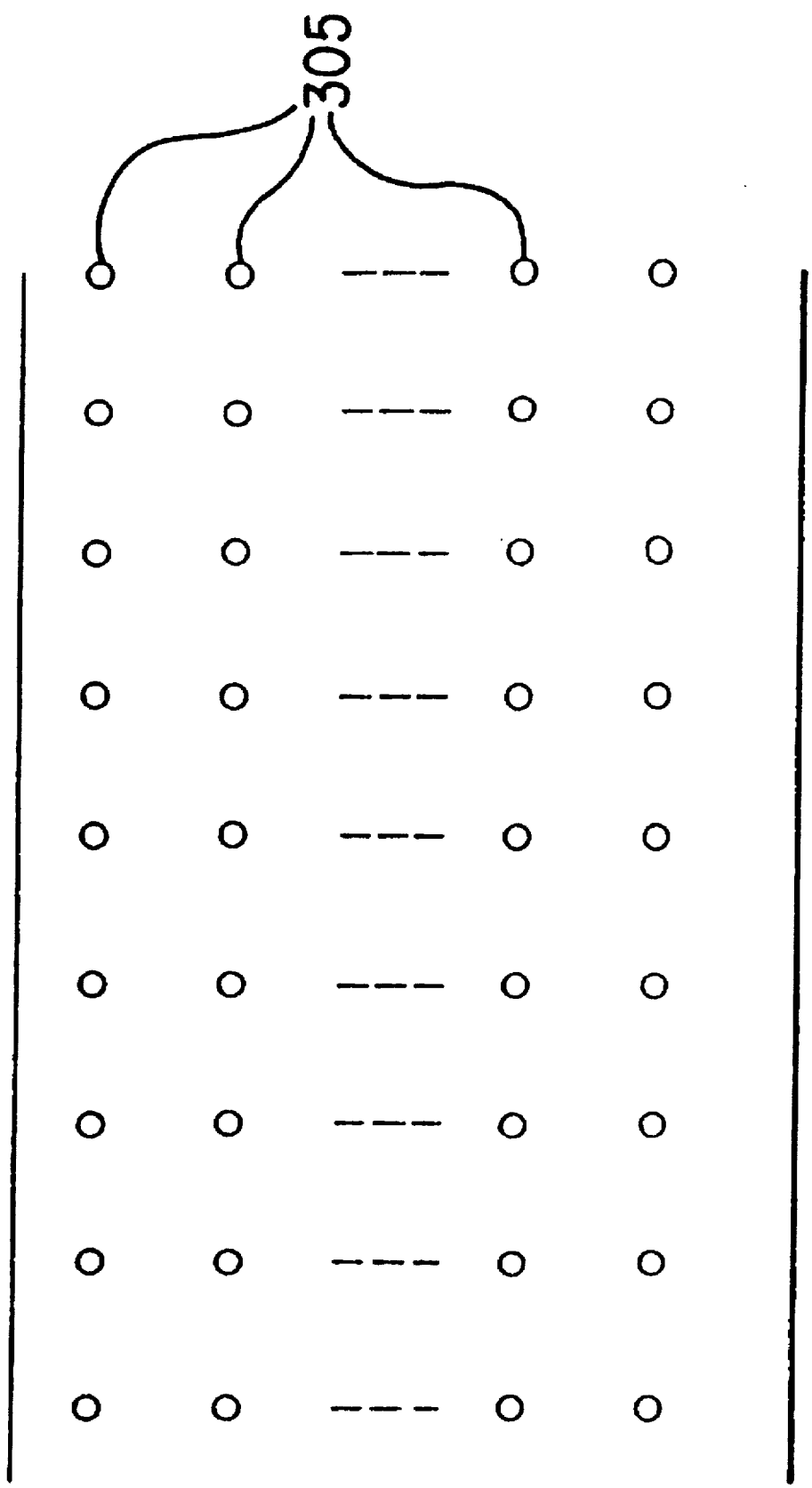
FIG. 7 is a top view of the single crystal seeds formed by the process of FIG. 6A–6D.

Instead of using a single excimer laser beam 120 as in FIG. 3B, four interfering excimer laser beam arrays 401–404 (only beam arrays 401 and 403 are shown) are used to crystallize the amorphous silicon layer 303 to form a two-dimensional array of nucleation seeds 305, as shown in FIG. 7. A single excimer laser beam is split into four excimer laser beams using semitransparent mirrors. Then, the resulting four excimer laser beams are focused on the same portions of the amorphous silicon layer 303. The energy of each individual beam is not sufficient to crystallize amorphous silicon. However, constructive interference of all four excimer laser beams provides enough energy for the crystallization process. In addition, constructive interference produces four laser beam arrays 401–404. The four laser beam arrays 401–404 are used to generate nucleation seeds 305.

The illuminated portions of the amorphous silicon layer 303 are melted and then crystallize to form nucleation seeds 305. A height of the nucleation seeds is the same as the thickness of the amorphous silicon layer 303. An average width of the nucleation seeds may be about 100–1000 Å depending on the optics used to focus the four excimer laser beams.

The laser fluence at each of the portions may be about 180–220 mJ/cm$^2$. Each of the four excimer laser beams may have a laser fluence of about one quarter (¼) of the total laser fluence illuminating each portion. Thus, each of the four excimer laser beams has a laser fluence of about 45–55 mJ/cm$^2$. The four excimer laser beam arrays 401–404 can be further directed with appropriate optics to adjust the positions and the widths of the nucleation seeds 305 so that the nucleation seeds 305 are located at appropriate positions and widths for forming TFTs.

The number of laser beam arrays may vary depending on the optics used to generate the laser beam arrays. Four beam arrays are preferred because it is simple to split a single excimer laser beam into four excimer laser beams. If two beams are used, then nucleation stripes are formed, for example. Also, if the laser beam arrays do not perfectly align due to limitations in the optics used, then portions of the amorphous silicon layer 303 illumined by a single laser beam array would not melt because only one fourth (¼) of the laser fluence is available.

Figure 6C:
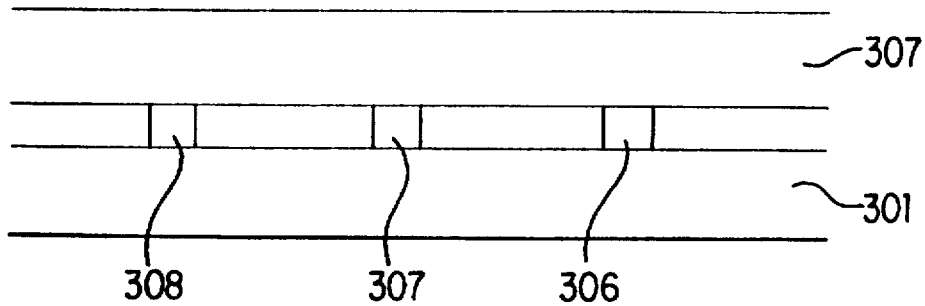
Figure 6D:
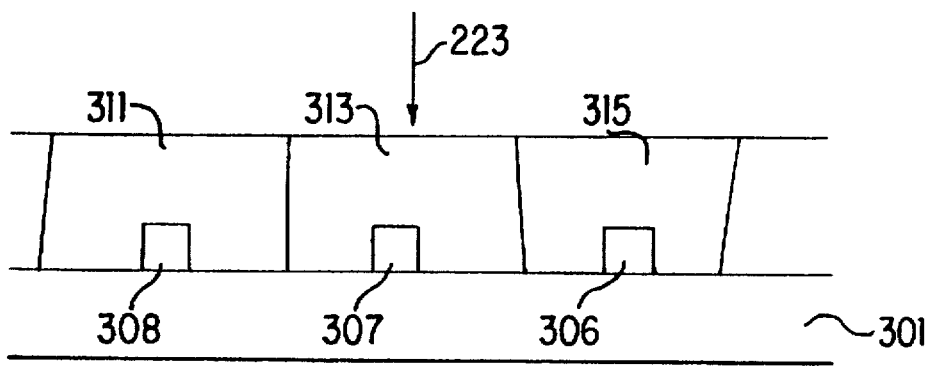

After the nucleation seeds 305 are formed, an amorphous silicon layer 307 is formed over the amorphous silicon layer 303 and the nucleation seeds 305. In FIG. 6C, three nucleation seeds 306, 307 and 308 are shown. The amorphous silicon layer 307 is melted by using an excimer laser beam 223 which may have a laser fluence of about 280–440 mJ/cm$^2$. The amorphous silicon layer 207 is then crystallized to form single silicon crystals 311, 313 and 315, as shown in FIG. 6D. TFTs are formed in the single silicon crystals 311, 313 and 315 by well known processes.

The embodiments described above provide single silicon crystals formed on a substrate by first forming nucleation seeds and then crystallizing an amorphous silicon layer formed over the nucleation seeds. The nucleation seeds are formed at the precise positions where TFTs are required. Thus, the invention provides a method for forming single silicon crystals properly positioned for each required TFT resulting in high performance TFTs.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A method for forming a plurality of single silicon crystals over a substrate, comprising:

forming a plurality of single crystal silicon nucleation sites over the substrate;

forming a first amorphous silicon layer over the substrate covering the plurality of single crystal silicon nucleation sites;

melting the first amorphous silicon layer using a first laser beam; and crystallizing the first amorphous silicon layer to form the plurality of single silicon crystals, wherein each of the plurality of single crystal silicon nucleation sites.

2. The method of claim 1, wherein the step of forming the plurality of single crystal silicon nucleation sites comprises:

forming a second amorphous silicon layer over the substrate;

melting the second amorphous silicon layer using a second laser beam;

crystallizing the second amorphous silicon layer into a polycrystalline silicon layer; and forming a plurality of single crystal seed columns by patterning and etching the polycrystalline silicon layer, wherein the plurality of single crystal seed columns are the plurality of single crystal silicon nucleation sites.

3. The method of claim 2, wherein a thickness of the second amorphous silicon layer is about 100–200 Å.

4. The method of claim 2, wherein the second laser is an excimer laser.

5. The method of claim 2, wherein a laser fluence of the second laser beam is about 180–220 mJ/cm$^2$.

6. The method of claim 2, wherein the plurality of seed columns have an average cross-sectional width of less than about 1000 Å.

7. The method of claim 6, wherein the plurality of seed columns have the average cross-sectional width of about 800–1000 Å.

8. The method of claim 1, wherein the step of forming the plurality of silicon nucleation sites comprises:

forming a nucleation layer over the substrate;

forming an insulative layer over the nucleation layer; and patterning and etching the insulative layer to expose a plurality of portions of the nucleation layer, the plurality of portions being the plurality of single crystal silicon nucleation sites.

9. The method of claim 8, wherein a thickness of the insulative layer is less than a thickness of the first amorphous silicon layer.

10. The method of claim 9, wherein the thickness of the insulative layer is about one half the thickness of the first amorphous silicon layer.

11. The method of claim 8, wherein the nucleation layer is at least one of a metal layer and a silicon nitride layer.

12. The method of claim 1, wherein the step of forming the plurality of single crystal silicon nucleation sites comprises:

forming a third amorphous silicon layer over the substrate; and forming a plurality of nucleation seeds in the third amorphous silicon layer, wherein the plurality of nucleation seeds are the plurality of single crystal silicon nucleation sites.

13. The method of claim 12, wherein the third amorphous silicon layer has a thickness of about 100–200 Å.

14. The method of claim 12, wherein the plurality of nucleation seeds have an average width of less than about 1000 Å.

15. The method of claim 12, wherein the step of forming the plurality of nucleation seeds comprises:

melting a plurality of portions of the third amorphous silicon layer; and crystallizing the plurality of portions of the third amorphous silicon layer melted by the melting step to form the plurality of nucleation seeds.

16. The method of claim 15, wherein melting the plurality of portions of the third amorphous silicon layer comprises:

irradiating the plurality of portions of the third amorphous silicon layer using a plurality of laser beam arrays, one beam of each of the plurality of laser beam arrays irradiating one of the plurality of portions of the third amorphous silicon layer.

17. The method of claim 16, wherein a total laser fluence irradiating each of the plurality of portions of the third amorphous silicon layer is about 180–220 mJ/cm$^2$.

18. The method of claim 1, wherein a thickness of the first amorphous silicon layer is about 800–1000 Å.

19. The method of claim 1, wherein the first laser beam is an excimer laser beam.

20. The method of claim 1, wherein a laser fluence of the first laser beam is about 280–440 mJ/cm$^2$.

* * * * *